(12) United States Patent
Coleman, Jr., deceased

(10) Patent No.: US 6,625,047 B2
(45) Date of Patent: Sep. 23, 2003

(54) MICROMECHANICAL MEMORY ELEMENT

(75) Inventor: Donald J. Coleman, Jr., deceased, late of Murphy, TX (US), by Linda S. Coleman, legal representative

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/036,610

(22) Filed: Dec. 31, 2001

(65) Prior Publication Data

US 2002/0097136 A1 Jul. 25, 2002

Related U.S. Application Data

(60) Provisional application No. 60/259,102, filed on Dec. 31, 2000.

(51) Int. Cl.$^7$ ............................ G11C 5/02; H01L 27/10; H01L 21/82
(52) U.S. Cl. .................... 365/51; 365/164; 257/208; 438/129
(58) Field of Search ............................ 438/128, 129, 438/130, 131, 132; 365/51, 52, 63, 66, 129, 157, 164, 166; 257/202, 208, 211

*Primary Examiner*—Evan Pert
(74) *Attorney, Agent, or Firm*—Charles A. Brill; Wade James Brady, III; Frederick J. Telecky, Jr.

(57) ABSTRACT

A micromechanical memory 100 element comprising a deflectable member 102 located between a first member 104 and a second member 106. The first member 104 is biased at a first member voltage, and the second member 106 is biased at a second member voltage. A bias voltage applied to the deflectable member will drive the deflectable member to either the first member 104 or the second member 106. A first contact 108 is positioned on the top, or end, of the first member 104. A second contact 110 is positioned on the top, or end, of the second member 106. These contacts are biased through resistors 112 and 114 with a first and second contact voltage sufficient to hold the deflectable member in place even after removal of the bias voltage applied to the deflectable member. The state of the micromechanical memory element can be determined by sensing the voltage of the deflectable member 102.

49 Claims, 4 Drawing Sheets

MICROMECHANICAL MEMORY ELEMENT

This application claims priority under 35 USC § 119(e)(1) of provisional application No. 60/259,102 filed Dec. 31, 2000.

FIELD OF THE INVENTION

This invention relates to the field of micro-electro-mechanical systems (MEMS), more particularly to micromechanical memory cells.

BACKGROUND OF THE INVENTION

Static random access memory (RAM) is formed using a bistable circuit element, the cross-coupled latch. The cross-coupled latch typically is formed using six transistors. Each element of the static RAM holds one bit of information in the cross-coupled latch. Once the static RAM cell has been written to, the data is held without further action. A read operation from the static RAM is non-destructive, in that it does not deplete the stored data, and the data may be read from the static RAM multiple times.

A dynamic RAM uses only a single transistor to gate a charge on a capacitor. The state of the capacitor is read back through the same gate transistor. The capacitor can only store the charge, and therefore the information, for a limited time. Reading the state of the stored charge also depletes the charge. A dynamic RAM periodically must be refreshed to reinstate the charge on the capacitor. It is common practice to perform a rewrite operation after each read operation to ensure a sufficient charge remains stored on the capacitor. What is needed is a memory element that is bistable like the static RAM, yet composed of very few circuit elements like the dynamic RAM.

SUMMARY OF THE INVENTION

Objects and advantages will be obvious, and will in part appear hereinafter and will be accomplished by the present invention which provides a method and system for a micromechanical memory element. One embodiment of the claimed invention provides a micromechanical memory element. The micromechanical memory element comprising: a pass transistor; a first member biased at a first member voltage; a second member biased at a second member voltage; a deflectable member between the first and second members, the deflectable member receiving an electrical signal from the pass transistor, the deflectable member operable to deflect toward the first member when the electrical signal is a first state, and toward the second member when the electrical signal is a second state; a first contact positioned to contact the deflectable member when the deflectable member is deflected toward the first member, the first contact providing a first contact voltage operable to hold the deflectable member in contact with the first contact in the absence of a signal from the pass transistor; and a second contact positioned to contact the deflectable member when the deflectable member is deflected toward the first member, the second contact providing a second contact voltage operable to hold the deflectable member in contact with the second contact in the absence of a signal from the pass transistor.

Another embodiment of the present invention provides a micromechanical memory element. The micromechanical memory element comprising: means for deflecting a deflectable member in one of two positions depending on a state of an input signal line; means for holding the deflectable member in the deflected state; and means for detecting the deflected state.

Another embodiment of the present invention provides a micromechanical memory element. The micromechanical memory element comprising: a pass transistor; a first member biased at a first member voltage; a deflectable member receiving an electrical signal from the pass transistor, the deflectable member operable to deflect toward the first member when the electrical signal is a first state; and a first contact positioned to contact the deflectable member when the deflectable member is deflected toward the first member, the first contact providing a first contact voltage operable to hold the deflectable member in contact with the first contact in the absence of a signal from the pass transistor.

Another embodiment of the present invention provides a method of forming a micromechanical memory element. The method comprising: providing a semiconductor substrate; forming addressing circuitry on the substrate; forming a first member and a first contact on the substrate, the first member and the first contact electrically connected to the addressing circuitry; forming a first sacrificial layer on the substrate; and forming a deflectable member on the first sacrificial layer, the deflectable member electrically connected to the substrate.

Another embodiment of the present invention provides a method of forming a micromechanical memory element. The method comprising: providing a semiconductor substrate; forming addressing circuitry on the substrate; forming a first member and a first contact on the substrate, the first member and the first contact electrically connected to the addressing circuitry; forming a first sacrificial layer on the substrate; forming a deflectable member on the first sacrificial layer, the deflectable member electrically connected to the substrate; forming a second sacrificial layer on the deflectable member; forming a second member and a second contact on the second sacrificial layer, the second member and the second contact electrically connected to the addressing circuitry; and removing the first and second sacrificial layers.

The disclosed micromechanical memory element may provide the stability of a conventional static RAM and the low component count of a conventional dynamic RAM.

BRIEF DESCRIPTION OF THE DRAWINGS

For a more complete understanding of the present invention, and the advantages thereof, reference is now made to the following, descriptions taken in conjunction with the accompanying drawings, in which.

DETAILED DESCRIPTION OF THE PREFERRED EMBODIMENTS

Figure 1:
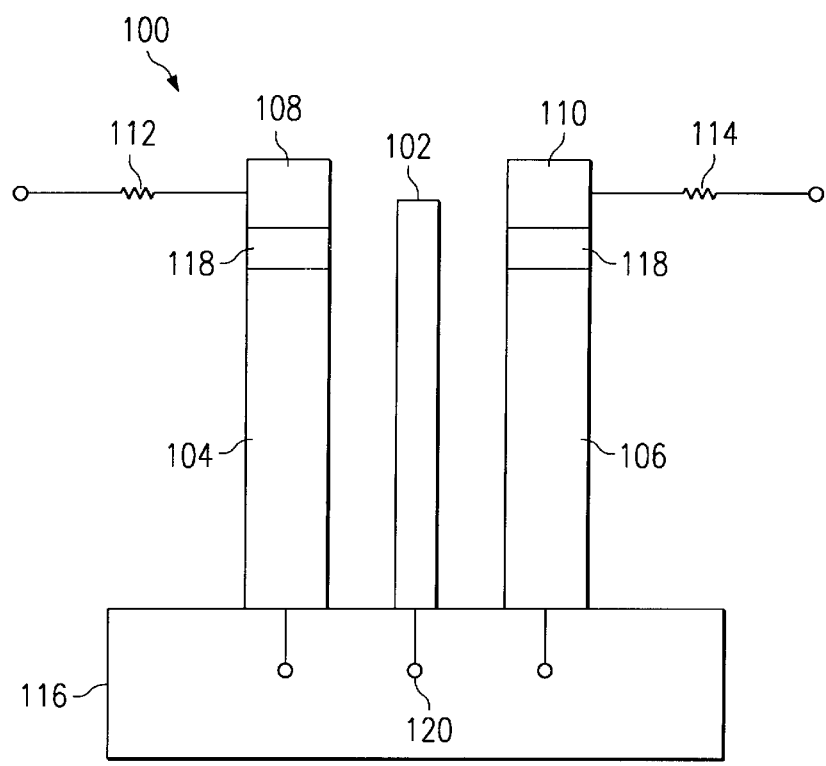
FIG. 1 is a side view of a micromechanical memory element according to one embodiment of the present invention.

FIG. 1 is a side view of a micromechanical memory element 100 according to one embodiment of the present invention. In FIG. 1, a deflectable member 102 is located between a first member 104 and a second member 106. The first member 104 is biased at a first member voltage, and the second member 106 is biased at a second member voltage.

When an electric field is established between the first and second members, the surface charge density is given by $\in E$, where $\in$ is the dielectric permeability of the insulating space between the first and second members and E is the electric field strength at the surface. The pressure acting on a unit area of the either member is the charge density times the field or $\in E^2$. This force is independent of the sign of the charge and is always an attractive force. The deflectable member 102 placed between the first member 104 and the second member 106 will experience a force attracting it to both the first and second members.

If the deflectable member is biased at a point evenly between the first and second members, these attractive forces will cancel, otherwise the deflectable member will experience an unbalance force and be deflected. Depending on the voltages involved and the compliance of the deflectable member, the deflectable member may be forced to collapse against the first or second members.

As an illustrative example of the forces involved at the micromechanical dimensions, if a first member is held at 1.8V and the deflectable member is held at 0V, and the separation between the first and deflectable members is 0.05 $\mu$m, the electrostatic pressure on the cantilevered deflectable member is then about 1.2 $\mu g/\mu m^2$. This pressure is about the same as the mass per unit area of a 0.05 $\mu$m thick silicon cantilever.

FIG. 1 shows a first contact 108 positioned on the top, or end, of the first member 104. A second contact 110 is positioned on the top, or end, of the second member 106. These contacts are biased through resistors 112 and 114. The purpose of the contacts is to hold the deflectable member in place once the deflectable member is deflected against the contact.

For example, assume a first member voltage is applied to the first member 104 and a second member voltage is applied to the second member 106. The deflectable member 102 is biased at a voltage closer to the second member voltage than the first member voltage, so the net attractive force on the deflectable member is toward the first member. If the attractive force is large enough—if the voltages are high enough-the deflectable member will collapse toward the first member and make contact with the first contact.

The first contact 108 is positioned to stop the movement of the deflectable member 102 before the deflectable member 102 comes into contact with the first member 104. Contact between the first contact 108 and the deflectable member 102 establishes an electrical connection between them. Resistor 112 limits the current generated by a difference between the bias voltage of the deflectable member and the first member voltage applied to the first member.

Once contact is established between the first contact 108 and the deflectable member 102, removal of the bias voltage applied to the deflectable member 102 allows the deflectable member to assume the first contact voltage applied to the first contact. Assuming the first contact voltage is sufficiently different from the first member voltage, the deflectable member will remain deflected against the first contact. No current will flow through the device after the bias voltage is removed from the deflectable member.

Figure 2:
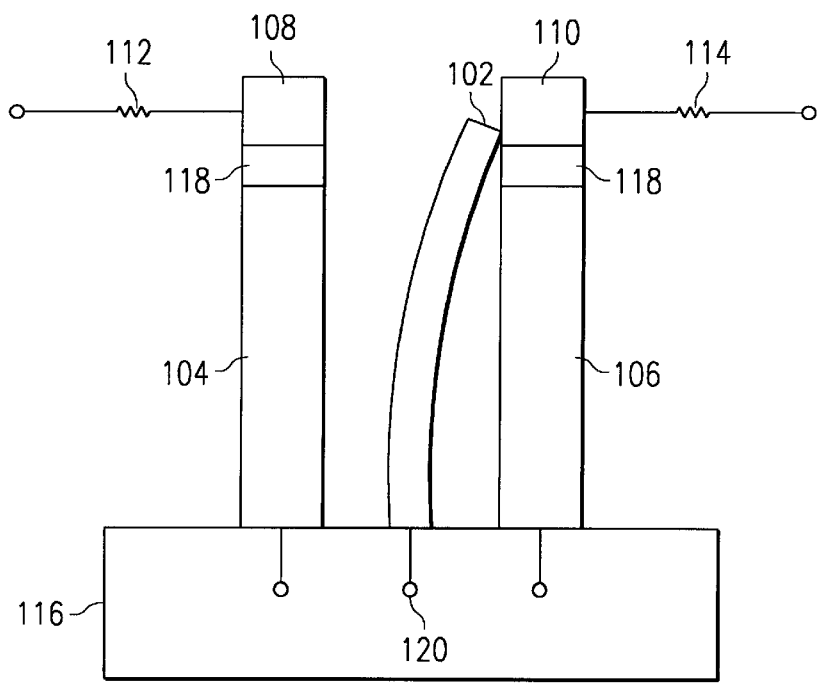
FIG. 2 is a side view of the micromechanical memory element of FIG. 1 showing the deflectable member deflected to touch one of the contacts.

In a similar manner, if the deflectable member 102 is biased at a voltage closer to the first member voltage, the deflectable member 102 will deflect toward the second member 104 due to the greater electrostatic force. FIG. 2 is a side view of the micromechanical memory element of FIG. 1 showing the deflectable member 102 deflected against the second contact 110.

The micromechanical memory elements shown in FIGS. 1 and 2 may be formed from a deposited metal layer, typically a sputtered aluminum alloy, or from silicon—either crystalline or polycrystalline—through any of the available micromachining techniques known in the art. Various micromachining techniques etch the members from a solid layer, or deposit the members in holes formed in a sacrificial layer. The members shown may be directed out of the plane of the substrate 116, or supported above the substrate and parallel to the substrate 116.

The first and second contacts are isolated from the first and second members by an insulating layer 118. In alternate embodiments the first and second contacts are not supported by the first and second members but rather are separate from the first and second members.

Resistors 112 and 114 prevent the deflectable member 102 and the first and second contacts 108, 110 from welding upon contact. The resistors may be formed in the supply lines connected to the contacts, or may be a resistive coating on the contact itself. Use of a resistive coating results in the resistor being located between the contact and the deflectable member, not between the contact and a voltage supply as shown in FIG. 1.

According to one embodiment of the present invention, the first contact and second member receive the same bias voltage. The second contact and the first member receive another common bias voltage. These two common bias voltages may be equal to the two states of the electrical signal 120 supplied to the deflectable member 102.

The state of the micromechanical memory element can be read by sensing the voltage of the deflectable member when it is not being driven by an input voltage. When deflected, the deflectable member will assume the voltage of either the first contact 108 or the second contact 110.

While it is beneficial for the deflectable member to stay against the contact when the electrical signal 120 supplied to the deflectable member is removed, it is not desirable for the deflectable member 102 to become stuck to either contact. Stiction is common in micromechanical devices and is caused by van der Waals force, as well as cold welding, arcing, and the surface tension of liquids formed on the contacting parts. To overcome stiction, a lubricant or passivation layer may be used. One lubricant used in micromirror devices if perfluorodecanoic acid, or PFDA. PFDA is deposited in a monolayer, typically through a vapor deposition, and forms an extremely low energy surface.

In spite of the use of a lubricant, it may be difficult to get the deflectable member 102 to reliably release from the first and second contacts when an electrical signal 120 supplied to the deflectable member changes states. This is because the electrostatic field is a square function of the distance between the two members. Therefore, even a large voltage difference between the deflectable member 102 and the first member 104 may not overcome the forces generated by a very small voltage difference between the deflectable member 102 and the second member 106 when the deflectable member 102 is deflected against the second contact 110 as shown in FIG. 2.

Figure 3:
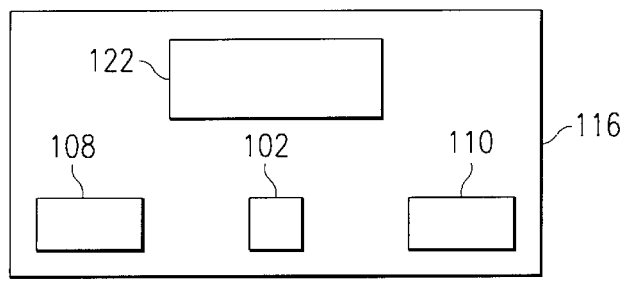
FIG. 3 is a top view of a micromechanical memory element similar to the element of FIG. 1 showing the location of a reset electrode.

Reset techniques may be used to force a deflectable member to return to a neutral position. FIG. 3 is a top view of a micromechanical memory element similar to the element of FIG. 1 showing the location of a reset electrode 122. The reset electrode 122 is used to establish a very strong electrostatic field between the deflectable member 102 and the reset electrode 122. This very strong electrical field pulls the deflectable member away from the first and second contacts and allows the deflectable member 102 to return to a neutral position.

The reset voltage applied to the reset electrode 122 may be one or more reset pulses. Reset pulses are used to reset micromirror devices. The reset deforms the deflectable member 102 to store energy in the deflectable member 102. When the pulse is removed, the deformed deflectable member straightens and springs away from the contact.

Figure 4:
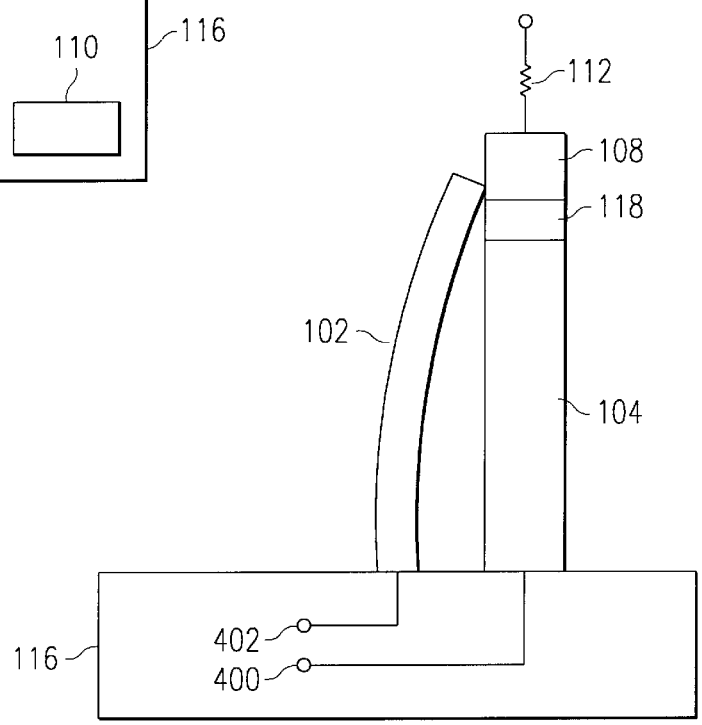
FIG. 4 is a side view of a micromechanical memory element of another embodiment of the present invention.

FIG. 4 is a side view of a micromechanical memory element of another embodiment of the present invention. The micromechanical memory element 400 of FIG. 4 uses only the first member and first contact of the embodiment of FIG. 1. In FIG. 4, an electrical signal 402 applied to the deflectable member 102 may assume one of two voltage states. The first member 104 is biased at the first voltage state. When the deflectable member 102 assumes the second voltage state, the deflectable member is deflected to contact the first contact 108. The first contact is biased to a voltage sufficient to keep the deflectable member 102 against the first contact 108 even when the electrical signal 402 is removed.

When the undeflected deflectable member 102 receives the first voltage state, no electrical field exists between the deflectable member 102 and the first member—which is also biased at the first voltage state—so the deflectable member 102 is not deflected. The voltage of the deflectable member is once again sensed to determine the state of the memory element. A resistor between the deflectable member and the first voltage state—often ground—may be necessary to assist reading from the memory element when the deflectable member is not deflected.

Figure 5:
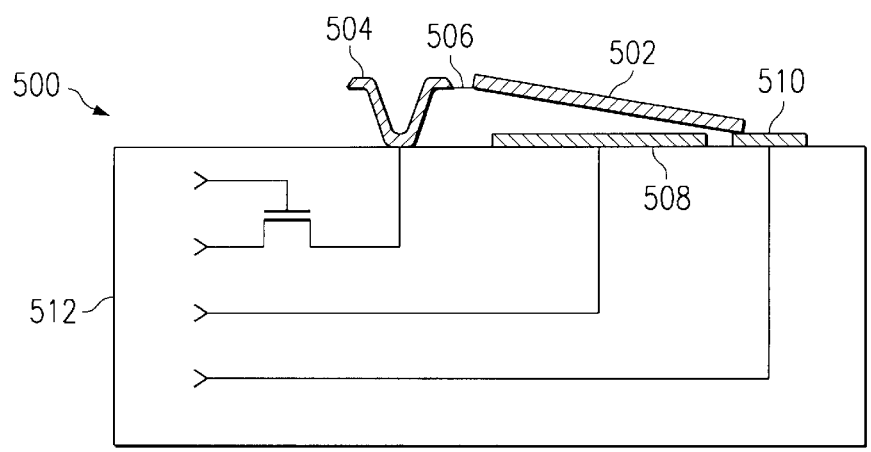
FIG. 5 is a side view of a micromechanical memory element, similar to the one shown in FIG. 4, formed on the surface of a semiconductor wafer.

FIG. 5 is a side view of a micromechanical memory element 500 similar to the one shown in FIG. 4 formed on the surface of a semiconductor wafer. In FIG. 5, the deflectable member 502 is supported above the substrate 512 by a deflectable member support 504. The deflectable member 502 and the deflectable member support 504 to which it is connected are both formed from a metal layer. A thin region of the metal layer forms a hinge 506 which concentrates the deformation of the metal layer. The thin region may be a narrow portion of the layer, in the dimension perpendicular to FIG. 5 (not shown), or may be thin as shown and formed using the buried hinge methods used to form torsion beam micromirror devices.

A voltage differential between the deflectable member 502 and a first member 508 will pull the deflectable member 502 toward the first member 508. The first contact 510 is positioned to contact the deflectable member 502 and prevent the deflectable member from reaching the first member 508.

Figure 6:
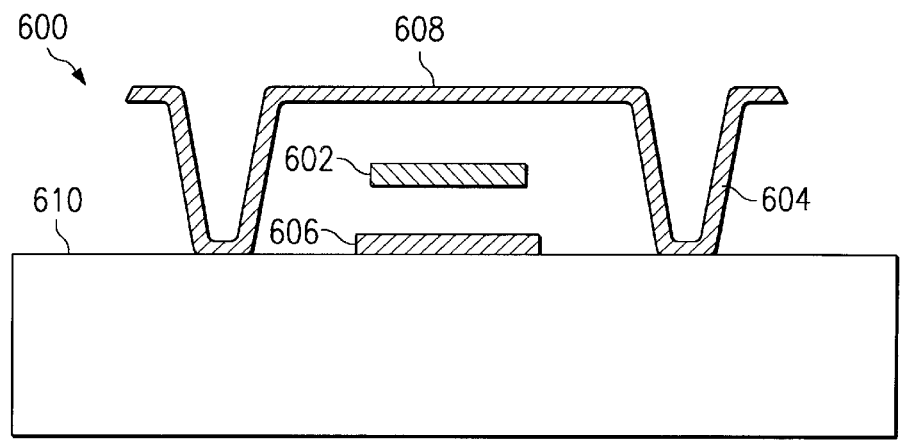
FIG. 6 is an end view of a micromechanical memory element, similar to the one shown in FIGS. 1 and 2, formed on the surface of a semiconductor wafer.

A micromechanical memory element similar to the one shown in FIGS. 1 and 2 may also be formed on the surface of a semiconductor wafer. FIG. 6 shows a micromechanical memory element 600 similar to the element of FIG. 5, but with a second member 608 formed above the deflectable member 602. The view of FIG. 6 is from the end of an element similar to that shown in FIG. 5. The second member 608 is supported above the substrate 610 by supports 604. The deflectable member 602 is supported above the substrate by a support similar to the support shown in FIG. 5 (not shown in FIG. 6). A first member 606 is formed on the substrate 610. The first and second contacts are not shown in FIG. 6.

Figure 7:
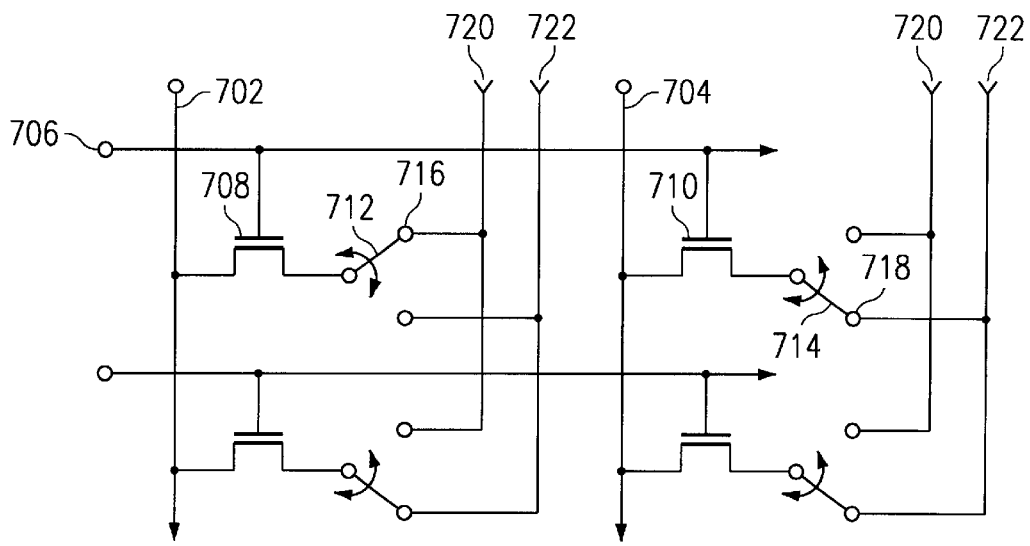
FIG. 7 is a schematic view of a portion of a micromechanical memory array.

FIG. 7 is a schematic view of a very small portion of a micromechanical memory array. The micromechanical elements described herein are written to and read from using the same types of circuitry commonly used to read and write to semiconductor memory arrays. In FIG. 7, a first bitline 702 and a second bitline 704 are shown. Each bitline provides a data bit signal to a column of memory elements. When a first wordline 706 is active, pass transistors 708 and 710 are turned on enabling the data on bitlines 702 and 704 to pass through to the micromechanical switches. The voltage signal on bitline 702 is provided to the deflectable member 712 while the voltage signal on bitline 704 is provided to the deflectable member 714. The voltage signal on bitline 702 forces deflectable member 712 to deflect toward a first member and touch a first contact 716, while the voltage signal on bitline 704 is forces the deflectable member 714 to deflect toward a second member and touch a second contact 718.

The memory array is read by enabling the pass transistors using the appropriate wordline, and sensing the voltage provided to the bitlines. For example, driving wordline 706 active turns on pass transistors 708 and 710. When the pass transistors are turned on, the voltage provided by the first and second contacts, as appropriate, is provided to the bitline. In FIG. 7, the first bitline 702 is driven to a first contact voltage 720 while the second bitline 704 is driven to a second contact voltage 722.

A micromechanical memory element is fabricated on a semiconductor, typically silicon, substrate 804. Electrical control circuitry is typically fabricated in or on the surface of the semiconductor substrate 804 using standard integrated circuit process flows. This circuitry typically includes, but is not limited to, a pass transistor for each element, and a sense amplifier for each bit line of the memory array. The silicon substrate 104 and any necessary metal interconnection layers are isolated by an insulating layer 806 which is typically a deposited silicon dioxide layer on which the micromechanical memory element structure is formed. Holes 808, or vias, are opened in the oxide layer 806 to allow electrical connection with the electronic circuitry formed in the substrate 804.

Figure 8:
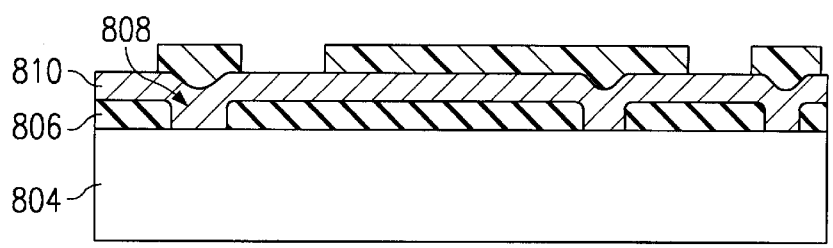
FIG. 8 is a side view of a wafer substrate shoeing the fabrication of a micromechanical memory device at a point after an initial etch mask has been patterned.

The first layer of the superstructure is a metalization layer 810. The metalization layer 810 is deposited on the insulating layer 806. An etch mask is then deposited over the metal layer and patterned to define the first member, first contact, and a support pad for the deflectable member. The etch mask may be photoresist or an oxide hard mask. FIG. 8 shows the etch mask after it has been patterned.

Figure 9:
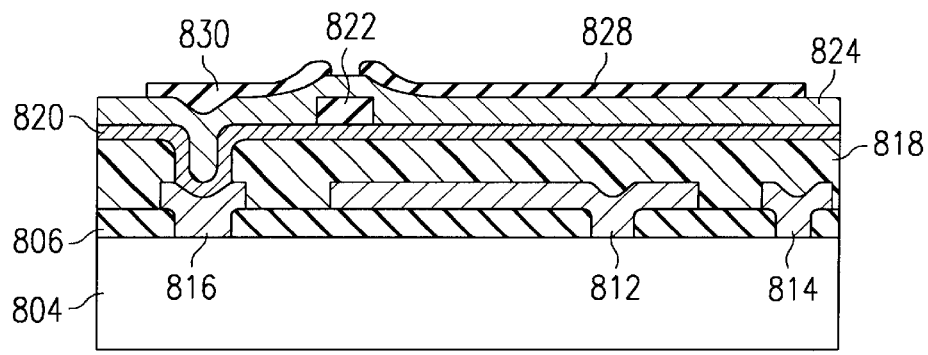
FIG. 9 is a side view of the wafer substrate of FIG. 8 showing the partially fabricated micromechanical memory device after the hinge etch mask, hinge support etch mask, and deflectable member etch mask have been completed.

The metal layer 810 is then etched using the etch mask to define the first member 812, the first contact 814, and a support pad 816 for the deflectable member. FIG. 9 shows the micromechanical memory element after a first planarizing photoresist spacer layer 818 has been spun onto the substrate wafer. A via is opened in the first planarizing photoresist spacer layer 818 to provide access to the support pad 816, and the first planarizing spacer layer is deep UV hardened to protect it during subsequent processing steps. This spacer layer and another spacer layer used later in the fabrication process are often called sacrificial layers since they are used only as forms during the fabrication process and are removed from the device prior to device operation.

A thin layer 820 of metal is sputtered onto the spacer layer and into the holes. According to the buried hinge fabrication method used to fabricate micromirror devices, an oxide is deposited over the thin metal layer 820 and patterned to form an etch mask 822 over the region of the thin metal layer 820 that will form the hinge. A thicker layer of metal 824, typically an aluminum alloy, is sputtered over the thin layer 820 and oxide etch mask 822. Another oxide mask is deposited over the thick metal layer 824 and patterned to define the deflectable member support and deflectable member. FIG. 9 shows the wafer with the hinge etch mask 822, the hinge support etch mask 830, and the deflectable member etch mask 828 in place.

Figure 10:
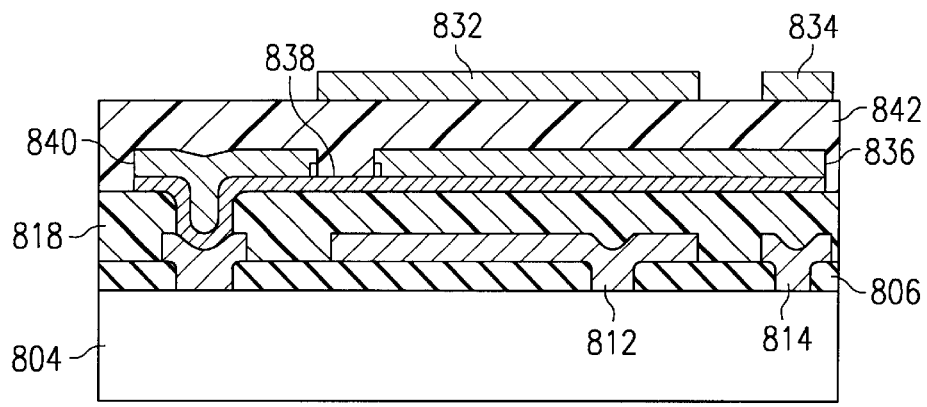
FIG. 10 is a side view of the wafer substrate of FIG. 9 after the second member and second contact have been formed on the second planarizing spacer layer.

After the etch masks have been formed, the thick and thin metal layers are etch simultaneously to form the deflectable member 836, thin hinge portion 838, and deflectable member support 840. The oxide etch masks are then stripped. The metal layers may be polished at this point to proved a planar surface on which to build the remainder of the device. At this point the fabrication of the single sided memory element of FIG. 5 is completed and the first planarizing spacer layer is removed. Alternatively, a second planarizing photoresist layer 842 is spun-on the wafer and another metal layer sputtered over the second planarizing photoresist layer. The metal layer is patterned to form a second member 832 and a second contact 834 above the deflectable member 836. The second member 832 and second contact 834 are supported by vias formed out of the plane of FIG. 10 and are not shown in FIG. 10.

Figure 11:
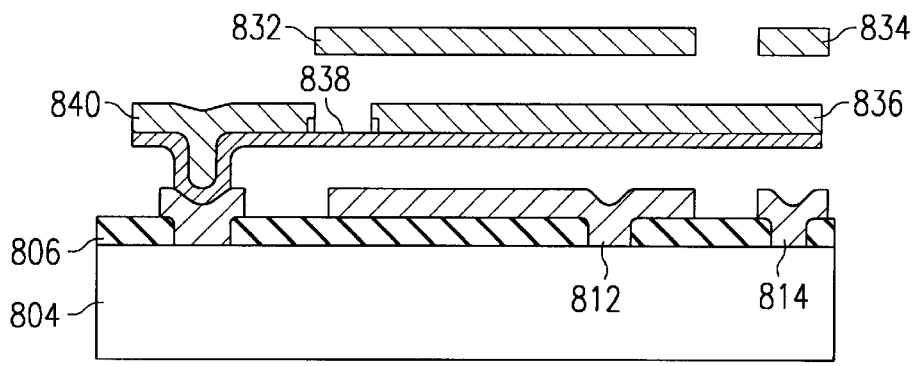
FIG. 11 is a side view of the wafer substrate of FIG. 10 after the first and second sacrificial spacer layers have been removed leaving the cantilevered deflectable member supported between the first member and the second member.

The first and second sacrificial photoresist layers are then ashed away, leaving a cantilevered deflectable member 836 supported between a first member 812 and a second member 832 as shown in FIG. 11.

Thus, although there has been disclosed to this point a particular embodiment for a micromechanical memory element and method therefore, it is not intended that such specific references be considered as limitations upon the scope of this invention except insofar as set forth in the following claims. Furthermore, having described the invention in connection with certain specific embodiments thereof, it is to be understood that further modifications may now suggest themselves to those skilled in the art, it is intended to cover all such modifications as fall within the scope of the appended claims. In the following claims, only elements denoted by the words "means for" are intended to be interpreted as means plus function claims under 35 U.S.C. § 112, paragraph six.

What is claimed is:

1. A micromechanical memory element comprising:
   a pass transistor;
   a first member biased at a first member voltage;
   a second member biased at a second member voltage;
   a deflectable member between said first and second members, said deflectable member receiving an electrical signal from said pass transistor, said deflectable member operable to deflect toward said first member when said electrical signal is a first state, and toward said second member when said electrical signal is a second state;
   a first contact positioned to contact said deflectable member when said deflectable member is deflected toward said first member, said first contact providing a first contact voltage operable to hold said deflectable member in contact with said first contact in the absence of a signal from said pass transistor; and
   a second contact positioned to contact said deflectable member when said deflectable member is deflected toward said first member, said second contact providing a second contact voltage operable to hold said deflectable member in contact with said second contact in the absence of a signal from said pass transistor.

2. The micromechanical memory element of claim 1, said deflectable member comprising a silicon deflectable member.

3. The micromechanical memory element of claim 1, said deflectable member comprising a metal deflectable member.

4. The micromechanical memory element of claim 1, said micromechanical memory element fabricated on a plane, said deflectable member deflecting parallel to said plane.

5. The micromechanical memory element of claim 1, said micromechanical memory element fabricated on a plane, said deflectable member deflecting perpendicular to said plane.

6. The micromechanical memory element of claim 1, said first member comprising a silicon member.

7. The micromechanical memory element of claim 1, said first member comprising a metal member.

8. The micromechanical memory element of claim 1, said first member comprising a first rigid member.

9. The micromechanical memory element of claim 1, said second member comprising a silicon member.

10. The micromechanical memory element of claim 1, said second member comprising a metal member.

11. The micromechanical memory element of claim 1, said second member comprising a second rigid member.

12. The micromechanical memory element of claim 1, said first contact located on said first member.

13. The micromechanical memory element of claim 1, said first contact located on said first member and electrically isolated from said first member.

14. The micromechanical memory element of claim 1, said second contact located on said second member.

15. The micromechanical memory element of claim 1, said second contact located on said second member and electrically isolated from said second member.

16. The micromechanical memory element of claim 1, said first contact being a resistive contact.

17. The micromechanical memory element of claim 1, said second contact being a resistive contact.

18. The micromechanical memory element of claim 1, said first contact voltage being said second member voltage.

19. The micromechanical memory element of claim 1, said second contact voltage being said first member voltage.

20. The micromechanical memory element of claim 1, further comprising a reset mechanism operable to move said deflectable member out of contact with said first and second contacts.

21. The micromechanical memory element of claim 1, further comprising a reset electrode, a reset voltage applied to said reset electrode operable to move said deflectable member out of contact with said first and second contacts.

22. The micromechanical memory element of claim 1, said deflectable member having a stiffness great enough to break contact with said first contact when said electrical signal is in said second state.

23. The micromechanical memory element of claim 1, said deflectable member having a stiffness great enough to break contact with said second contact when said electrical signal is in said first state.

24. The micromechanical memory element of claim 1, comprising:
   a sense amplifier electrically connected to said deflectable member and operable to detect a signal applied to said deflectable member.

25. The micromechanical memory element of claim 1, comprising:
   a sense amplifier electrically connected to said deflectable member through said pass transistor, said sense amplifier operable to detect a signal applied to said deflectable member.

26. The micromechanical memory element of claim 1, comprising:
   a bitline operable to deliver said electrical signal to said pass transistor.

27. The micromechanical memory element of claim 1, comprising:
   a wordline operable to deliver an enable signal to said pass transistor.

28. A micromechanical memory element comprising:
   means for deflecting a deflectable member in one of two positions depending on a state of an input signal line;
   means for holding said deflectable member in said deflected state; and
   means for detecting said deflected state.

29. The micromechanical memory element of claim 28, comprising:
   a means for reading the position of said deflectable member.

30. A micromechanical memory element comprising:
   a pass transistor;
   a first member biased at a first member voltage;
   a deflectable member receiving an electrical signal from said pass transistor, said deflectable member operable to deflect toward said first member when said electrical signal is a first state; and
   a first contact positioned to contact said deflectable member when said deflectable member is deflected toward said first member, said first contact providing a first contact voltage operable to hold said deflectable member in contact with said first contact in the absence of a signal from said pass transistor.

31. The micromechanical memory element of claim 30, said deflectable member comprising a silicon deflectable member.

32. The micromechanical memory element of claim 30, said deflectable member comprising a metal deflectable member.

33. The micromechanical memory element of claim 30, said micromechanical memory element fabricated on a plane, said deflectable member deflecting parallel to said plane.

34. The micromechanical memory element of claim 30, said micromechanical memory element fabricated on a plane, said deflectable member deflecting perpendicular to said plane.

35. The micromechanical memory element of claim 30, said first member comprising a silicon member.

36. The micromechanical memory element of claim 30, said first member comprising a metal member.

37. The micromechanical memory element of claim 30, said first member comprising a first rigid member.

38. The micromechanical memory element of claim 30, said first contact located on said first member.

39. The micromechanical memory element of claim 30, said first contact located on said first member and electrically isolated from said first member.

40. The micromechanical memory element of claim 30, said first contact being a resistive contact.

41. The micromechanical memory element of claim 30, further comprising a reset mechanism operable to move said deflectable member out of contact with said first contact.

42. The micromechanical memory element of claim 30, further comprising a reset electrode, a reset voltage applied to said reset electrode operable to move said deflectable member out of contact with said first contact.

43. The micromechanical memory element of claim 30, said deflectable member having a stiffness great enough to break contact with said first contact when said electrical signal is in said second state.

44. The micromechanical memory element of claim 30, comprising:
   a sense amplifier electrically connected to said deflectable member and operable to detect a signal applied to said deflectable member.

45. The micromechanical memory element of claim 30, comprising:
   a sense amplifier electrically connected to said deflectable member through said pass transistor, said sense amplifier operable to detect a signal applied to said deflectable member.

46. The micromechanical memory element of claim 30, comprising:
   a bitline operable to deliver said electrical signal to said pass transistor.

47. The micromechanical memory element of claim 30, comprising:
   a wordline operable to deliver an enable signal to said pass transistor.

48. A method of forming a micromechanical memory element, the method comprising:
   providing a semiconductor substrate;
   forming addressing circuitry on said substrate;
   forming a first member and a first contact on said substrate, said first member and said first contact electrically connected to said addressing circuitry;
   forming a first sacrificial layer on said substrate; and
   forming a deflectable member on said first sacrificial layer, said deflectable member electrically connected to said substrate.

49. The method of claim 48, comprising:
   forming a second sacrificial layer on said deflectable member;
   forming a second member and a second contact on said second sacrificial layer, said second member and said second contact electrically connected to said addressing circuitry; and
   removing said first and second sacrificial layers.

* * * * *